US009461232B2

(12) United States Patent
Kono et al.

(10) Patent No.: US 9,461,232 B2
(45) Date of Patent: Oct. 4, 2016

(54) THERMOELECTRIC CONVERSION ELEMENT

(71) Applicant: DENSO CORPORATION, Kariya, Aichi-pref. (JP)

(72) Inventors: Yasushi Kono, Nagoya (JP); Yuta Saiga, Nagoya (JP); Kotaro Mizunuma, Obu (JP)

(73) Assignee: DENSO CORPORATION, Kariya, Aichi-pref. (JP)

( * ) Notice: Subject to any disclaimer, the term of this patent is extended or adjusted under 35 U.S.C. 154(b) by 0 days.

(21) Appl. No.: 14/643,417

(22) Filed: Mar. 10, 2015

(65) Prior Publication Data

US 2015/0270468 A1 Sep. 24, 2015

(30) Foreign Application Priority Data

Mar. 20, 2014 (JP) ................................ 2014-058223

(51) Int. Cl.
*H01L 27/16* (2006.01)
*H01L 35/02* (2006.01)
*H01L 37/00* (2006.01)

(52) U.S. Cl.
CPC .................................... *H01L 37/00* (2013.01)

(58) Field of Classification Search
CPC ....... H01L 37/00; H01L 35/02; H01L 35/14; H01L 35/24; H01L 27/16
USPC ....... 136/205, 206, 208, 209, 210, 211, 212, 136/218
See application file for complete search history.

(56) References Cited

FOREIGN PATENT DOCUMENTS

| | | | |
|---|---|---|---|
| JP | 2012-109367 | | 6/2012 |
| JP | WO2012169377 | A1 * | 2/2015 |
| WO | WO 2013/151088 | | 10/2013 |

OTHER PUBLICATIONS

JPWO2012169377(A1) Feb. 2015, English equivalent of the specification.*

* cited by examiner

*Primary Examiner* — Susan D Leong
(74) *Attorney, Agent, or Firm* — Harness, Dickey & Pierce, P.L.C.

(57) ABSTRACT

A thermoelectric conversion element includes a magnetic body and an electromotive component. The magnetic body has a pipe shape. The electromotive component is arranged to at least one of an outer surface, an inner surface, and an inside of the magnetic body. The electromotive component contains a material having a spin orbit coupling. The magnetic body is magnetized in an axial direction and has a temperature gradient in a radial direction. The electromotive component is spirally arranged around the magnetic body along a circumferential direction.

16 Claims, 6 Drawing Sheets

1
P
21
3
3
2
24
22
M

THERMOELECTRIC CONVERSION ELEMENT

CROSS REFERENCE TO RELATED APPLICATION

This application is based on Japanese Patent Application No. 2014-58223 filed on Mar. 20, 2014, the disclosure of which is incorporated herein by reference in its entirety.

TECHNICAL FIELD

The present disclosure relates to a thermoelectric conversion element.

BACKGROUND

A thermoelectric conversion element converts thermal energy into electric power, for example, using the Seebeck effect. A p-type semiconductor and a n-type semiconductor are combined with each other in a thermo couple, and plural thermo couples are connected in series as a module, such that the thermoelectric conversion element takes out voltage. In order to take out sufficient voltage, it is necessary to connect many semiconductors in series, so the number of components increases in this case.

In recent years, a variety of thermoelectric conversion elements using the spin Seebeck effect are developed. JP 2012-109367A describes a thermoelectric conversion element including a magnetic body and an electromotive component arranged on the surface of the magnetic body. Plural electromotive components are connected in series, and the generation efficiency of electromotive force (spin Hall effect) is made different among the electromotive components according to the direction of electromotive force produced in each electromotive component, such that sufficient voltage is taken out However, the manufacture processes are increased and made complicated, because plural kinds of electromotive components are needed, in which the generation efficiency of electromotive force is different. In this case, it is difficult to reduce the manufacture cost. Moreover, it is difficult to raise the generation efficiency of electromotive force as a whole, because the electromotive components are connected in series in the state where the generation efficiency of electromotive force is different. In this case, it is hard to raise the power generation efficiency.

SUMMARY

It is an object of the present disclosure to provide a thermoelectric conversion element excellent in power generation efficiency at low cost.

According to an aspect of the present disclosure, a thermoelectric conversion element includes a magnetic body having a pipe shape; and an electromotive component arranged to at least one of an outer surface, an inner surface, and an inside of the magnetic body. The electromotive component contains a material having a spin orbit coupling (interaction). The magnetic body is magnetized in an axial direction and has a temperature gradient in a radial direction. The electromotive component is spirally arranged to the magnetic body along a circumferential direction.

The thermoelectric conversion element has the magnetic body, and the electromotive component is spirally arranged to the magnetic body along the circumferential direction of the magnetic body. The magnetic body is magnetized in the axial direction of the magnetic body. Therefore, when a temperature gradient is defined in the radial direction of the magnetic body, electromotive force is generated by each part of the electromotive component in one direction along the circumferential direction. That is, the electromotive force is generated in the same direction that goes from one end to the other end in the electromotive component at each part of the electromotive component, such that large voltage can be efficiently obtained as a whole. Therefore, the thermoelectric conversion element can raise the power generation efficiency.

Since the electromotive force is generated in the same direction by each part of the electromotive component that is formed spirally, it is not necessary to make the electromotive component partially different in material or structure for changing the generation efficiency of electromotive force. Therefore, the manufacture processes are decreased and simplified, such that the thermoelectric conversion element can be manufactured at low cost.

Accordingly, the thermoelectric conversion element excellent in power generation efficiency can be offered at low cost.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION

Figure 1:
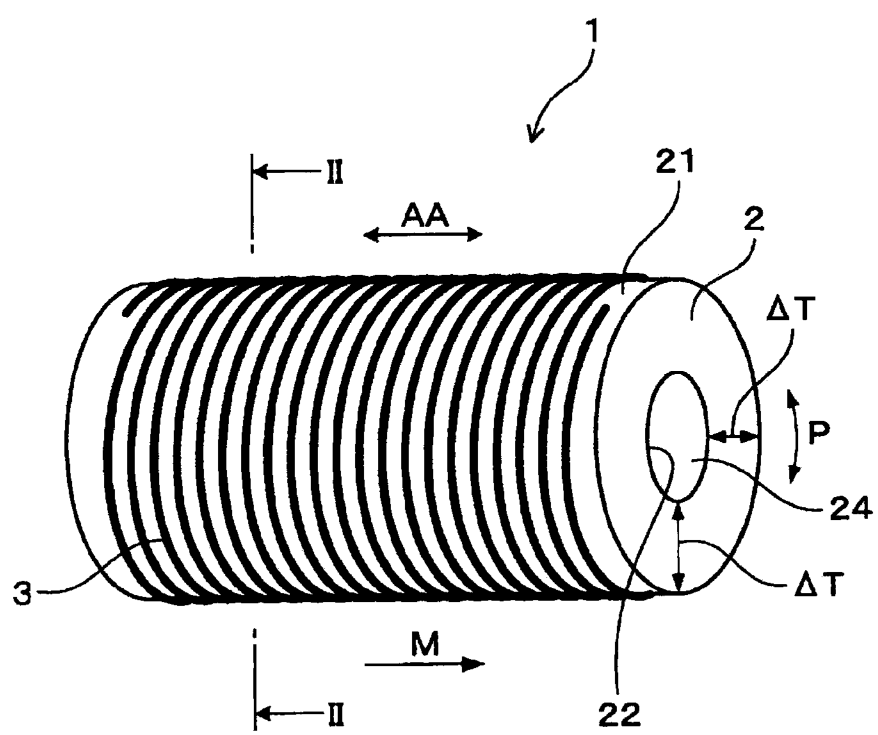
FIG. 1 is a perspective view illustrating a thermoelectric conversion element according to a first embodiment.

Embodiments of the present disclosure will be described hereafter referring to drawings. In the embodiments, a part that corresponds to a matter described in a preceding embodiment may be assigned with the same reference numeral, and redundant explanation for the part may be omitted. When only a part of a configuration is described in an embodiment, another preceding embodiment may be applied to the other parts of the configuration. The parts may be combined even if it is not explicitly described that the parts can be combined. The embodiments may be partially combined even if it is not explicitly described that the embodiments can be combined, provided there is no harm in the combination.

(First Embodiment)

A thermoelectric conversion element according to a first embodiment is described with reference to FIGS. 1-5.

Figure 2:
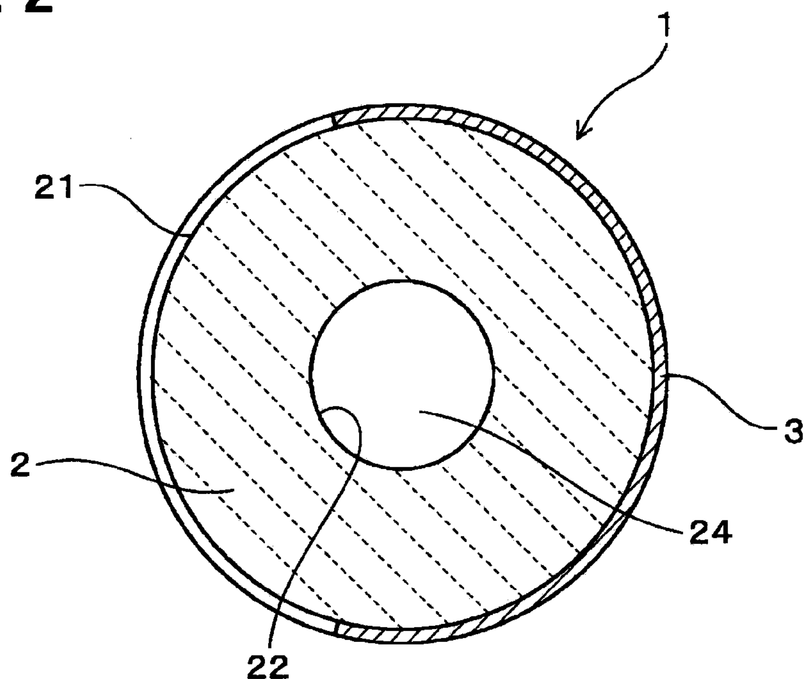
FIG. 2 is a cross-sectional view taken along a line II-II of FIG. 1.

As shown in FIG. 1 and FIG. 2, a thermoelectric conversion element 1 includes a magnetic body 2 having a cylindrical shape and an electromotive component 3 arranged around an outer circumference surface 21 of the magnetic body 2. The electromotive component 3 contains a material having a spin orbit coupling (interaction). The magnetic body 2 is magnetized in the axial direction AA. An arrow direction M in FIG. 1 expresses the magnetization direction. Moreover, the magnetic body 2 is configured so that temperature gradient ΔT is formed in a radial direction. The electromotive component 3 is spirally formed along the magnetic body 2 in the circumferential direction P.

The magnetic body may be magnetized beforehand, or may be magnetized by being arranged in a magnetic field. When the magnetic body is magnetized beforehand, the direction of the magnetic moment corresponds to the axial direction of the magnetic body. When a magnetic field is impressed to the magnetic body, the direction of the magnetic field corresponds to the axial direction of the magnetic body.

In addition, the axial direction, the radial direction, and the circumferential direction shall mean the axial direction, the radial direction, and the circumferential direction of the magnetic body having the cylindrical shape, unless described otherwise. Moreover, "along the circumferential direction" means that the direction of electromotive component (i.e., current flowing direction) has a component extending in the circumferential direction, and includes a slant state relative to the circumferential direction.

The magnetic body 2 has the shape of a cylinder. The magnetic body 2 has a shaft hole 24 with a cylindrical shape passing through the magnetic body 2 in the axial direction AA. The diameter of the shaft hole 24 is larger than the thickness of the magnetic body 2 in the radial direction. The magnetic body 2 may be made of magnetic insulator such as yttrium iron Garnett ($Y_3Fe_5O_{12}$), but is not limited to the magnetic insulator. Alternatively, the magnetic body 2 may be made of ferromagnetic metal such as permalloy.

In case where the magnetic body 2 is magnetized in the axial direction AA beforehand, for example, the magnetic body 2 is a ferromagnetic substance and may be in the state of permanent magnet having a magnetic moment in the axial direction AA.

In case where a magnetic field is impressed to the magnetic body 2 by being arranged in the magnetic field, the magnetic body 2 may be a paramagnetic material, and the thermoelectric conversion element 1 is used by applying an external magnetic field to the magnetic body 2 in the axial direction AA.

The electromotive component 3 includes a material having a spin orbit interaction. In other words, the electromotive component 3 may be made of metal material such as gold (Au), platinum (Pt) or palladium (Pd), or alloy materials thereof. The electromotive component 3 is preferably made of a material having a spin Hall resistance, for example, larger than or equal to $2\times10^{-7}$ Ωcm.

The electromotive component 3 has the spiral shape, and a sufficient interval is provided between parts of the electromotive component 3 adjacent to each other in the axial direction AA to an extent for securing electrical insulation. Alternatively, an insulating layer may be interposed between the parts of the electromotive component 3 adjacent to each other in the axial direction AA.

In the viewpoint of increasing the electromotive force, an angle θ defined between the axial direction AA and the electromotive component 3 (refer to FIGS. 4 and 5) is preferably set close to 90 degrees, but is not limited. The angle θ may be set in a range of $45°\leq\theta<90°$, and is more desirably in a range of $80°\leq\theta<90°$.

Figure 4:
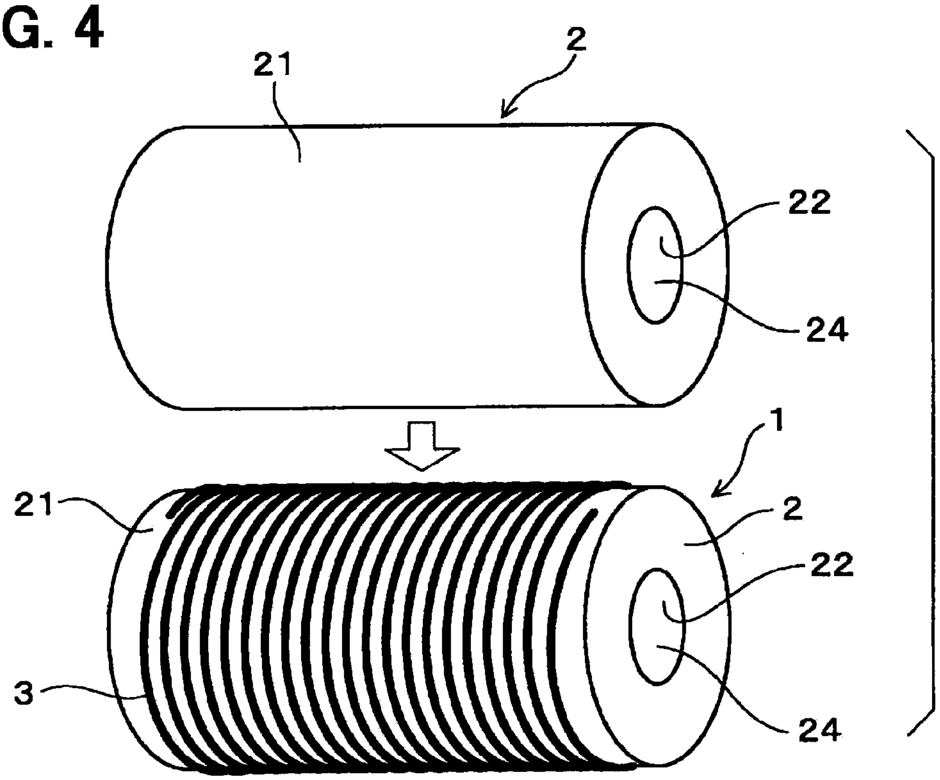
FIG. 4 is a perspective view illustrating a production method of the thermoelectric conversion element of the first embodiment.

As shown in FIG. 4, after producing the magnetic body 2, the electromotive component 3 is formed around the outer circumference surface 21 of the magnetic body 2 by sputtering method, printing method, etc. such that the thermoelectric conversion element 1 is manufactured.

Figure 5:
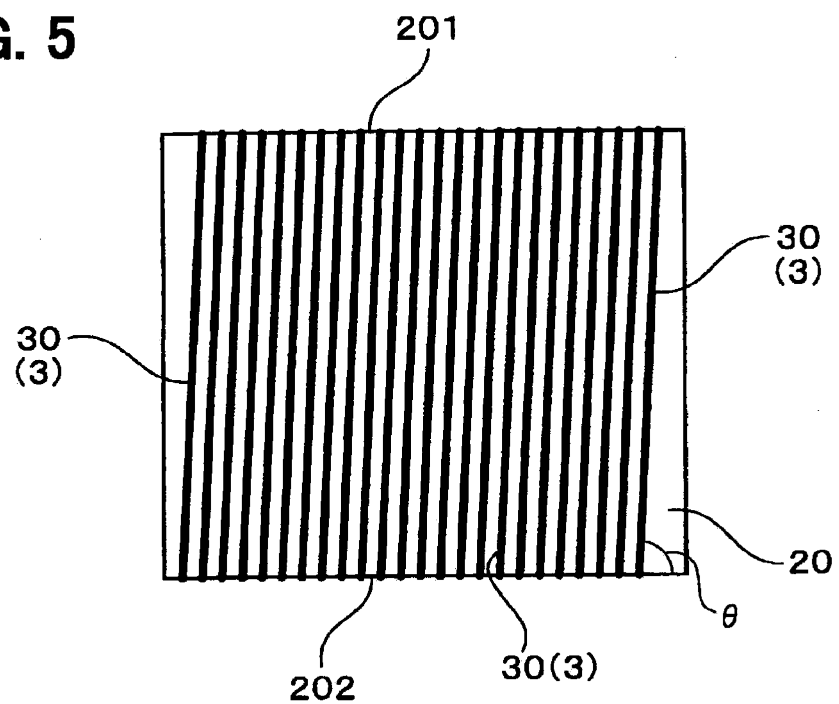
FIG. 5 is a view illustrating a production method of the thermoelectric conversion element of the first embodiment.

Alternatively, as shown in FIG. 5, plural electromotive-object patterns 30 are formed as pattern on the surface of magnetic body 20 having a rectangular board shape. Then, the board-shaped magnetic body 20 is rounded into a cylindrical shape in the state where the electromotive-object patterns 30 are located on the outer side, and the two sides 201 and 202 of the board-shaped magnetic body 20 are made in contact with each other. Further, the respective end of one of the electromotive-object patterns 30 is suitably connected to the respective end of the adjacent electromotive-object pattern 30. Thus, the thermoelectric conversion element 1 can be produced in which the electromotive component 3 is spirally formed on the outer circumference surface 21 of the magnetic body 2.

When using the thermoelectric conversion element 1, for example, high-temperature fluid is made to flow in the shaft hole 24 of the magnetic body 2, such that a difference in temperature (temperature gradient ΔT) is produced between the inner side and the outer side of the magnetic body 2. The high-temperature fluid may be gas such as exhaust gas of an internal-combustion engine, or liquid such as hot water. Alternatively, a temperature gradient ΔT may be formed by setting the outer side of the magnetic body 2 to have high temperature and by setting the inner side of the magnetic body 2 to have low temperature. For example, the difference in temperature (temperature gradient ΔT) between the inner side and the outer side of the magnetic body 2 may also be formed by circulating low-temperature fluid through the shaft hole 24 of the magnetic body 2.

The temperature gradient ΔT is formed between the inner side and the outer side of the magnetic body 2 in the radial direction by circulating hot fluid through the shaft hole 24. Thereby, due to the spin Seebeck effect, a flow of spin (spin flow) is induced in a direction parallel to the direction of temperature gradient ΔT (i.e., the radial direction) in the magnetic body 2. The spin flow flows into the electromotive component 3 arranged on the outer circumference surface 21 of the magnetic body 2.

Figure 3:
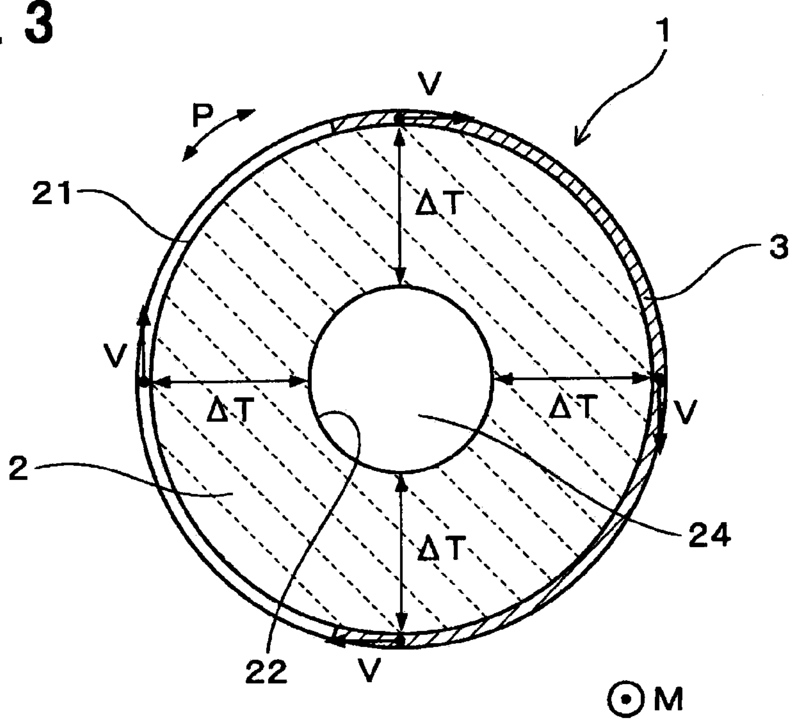
FIG. 3 is an explanatory view illustrating a magnetization direction, a direction of temperature gradient, and a direction of electromotive force in a cross-sectional view of the thermoelectric conversion element of the first embodiment.

The spin flow which flowed into the electromotive component 3 is converted into a flow of electron, that is a current (electromotive force V) in a direction (the circumferential direction P of the magnetic body 2) perpendicular to both the direction of temperature gradient ΔT (the radial direction of the magnetic body 2) and the magnetization direction M of the magnetic body 2 by a reverse spin Hall effect in the electromotive component 3. The electromotive force V is produced, as shown in FIG. 3, in each part of the electromotive component 3.

The direction of the electromotive force V produced in each part is the same from one end to the other end of the electromotive component 3.

The thermoelectric conversion element 1 has the cylindrical magnetic body 2 and the electromotive component 3 spirally formed along the circumferential direction P of the magnetic body 2. The magnetic body 2 has the magnetization direction M in the axial direction AA. The temperature gradient ΔT is formed in the radial direction of the magnetic body 2, and the electromotive force V is generated by each part of the electromotive component 3 in the one direction corresponding to the circumferential direction P of the magnetic body 2. That is, the electromotive force V having the same direction that goes to the other end from one end of the electromotive component 3 is generated by each part of the electromotive component 3. Accordingly, a large voltage can be efficiently obtained as a whole. Therefore, the thermoelectric conversion element 1 can raise the power generation efficiency.

Since the electromotive force V generated by each part of the spiral electromotive component 3 has the same direction, it is not necessary to make the electromotive component 3 partially different in material or structure for producing different generation efficiencies of the electromotive force. Therefore, the manufacture processes of the thermoelectric conversion element 1 can be reduced and simplified, such that the thermoelectric conversion element 1 can be manufactured at low cost.

The electromotive component 3 is arranged around the outer circumference surface 21 of the magnetic body 2. Therefore, when fluid such as exhaust gas is made to flow through the shaft hole 24 of the magnetic body 2, the electromotive component 3 is restricted from being polluted or affected by the fluid.

In other words, the electromotive component 3 is less affected by the heat source.

Since the magnetic body 2 has the cylindrical shape, it is easy to make the angle defined between the radial direction of the magnetic body 2 and the electromotive component 3 close to a right angle (90°) at all parts or selected part of the electromotive component 3. As a result, the electromotive force V produced on the electromotive component 3 can be efficiently obtained.

Accordingly, the thermoelectric conversion element 1 excellent in power generation efficiency can be offered at low cost.

(Second Embodiment)

Figure 6:
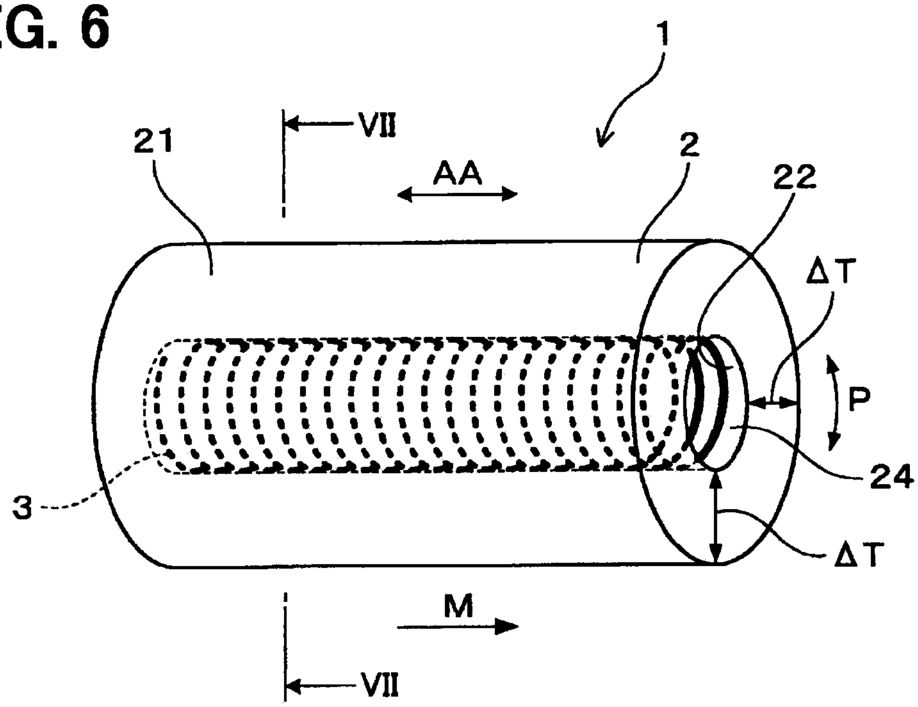
FIG. 6 is a perspective view illustrating a thermoelectric conversion element according to a second embodiment.
Figure 7:
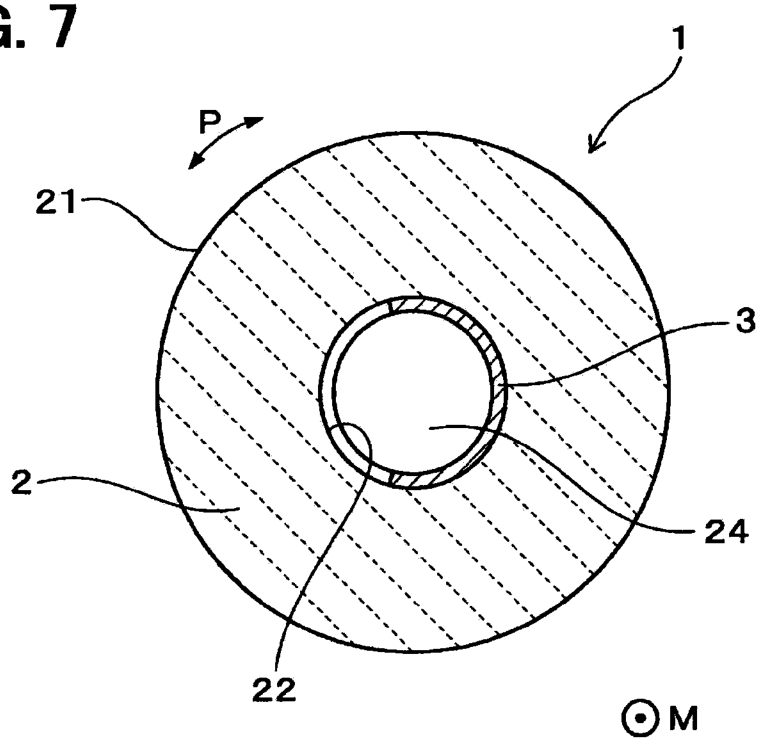
FIG. 7 is a cross-sectional view taken along a line VII-VII of FIG. 6.

A thermoelectric conversion element 1 according to a second embodiment is described with reference to FIG. 6 and FIG. 7 in which an electromotive component 3 is arranged on the inner circumference surface 22 of the magnetic body 2 having the cylindrical shape. The electromotive component 3 is spirally formed in the circumferential direction P, on the inner circumference surface 22 defined around the shaft hole 24 of the magnetic body 2. The electromotive component 3 is not formed on the outer circumference surface 21 of the magnetic body 2.

The thermoelectric conversion element 1 of the present embodiment is produced as follows, but is not limited. After forming the electromotive component pattern 30 on the surface of the magnetic body 20 having the board shape, similarly to FIG. 5, the magnetic body 20 having the board shape is rounded into a cylindrical shape in the state where the electromotive component pattern 30 is located on the inner side. Thus, the thermoelectric conversion element 1 can be obtained in which the electromotive component 3 is formed on the inner circumference surface 22 of the magnetic body 2. Other manufacture processes are the same as those of the first embodiment.

In the second embodiment, by forming a temperature gradient ΔT between the inner side and the outer side of the magnetic body 2 in the radial direction, a spin flow is induced to the magnetic body 2, due to the spin Seebeck effect, and the spin flow which goes inward in the radial direction flows into the electromotive component 3. The spin flow which flowed into the electromotive component 3 is converted into the electromotive force V in the circumferential direction P of the magnetic body 2, by the reverse spin Hall effect in the electromotive component 3.

Thus, also in this embodiment, the electromotive force V can be efficiently produced in the electromotive component. In addition, similar effects and advantages can be obtained as the first embodiment.

(Third Embodiment)

Figure 8:
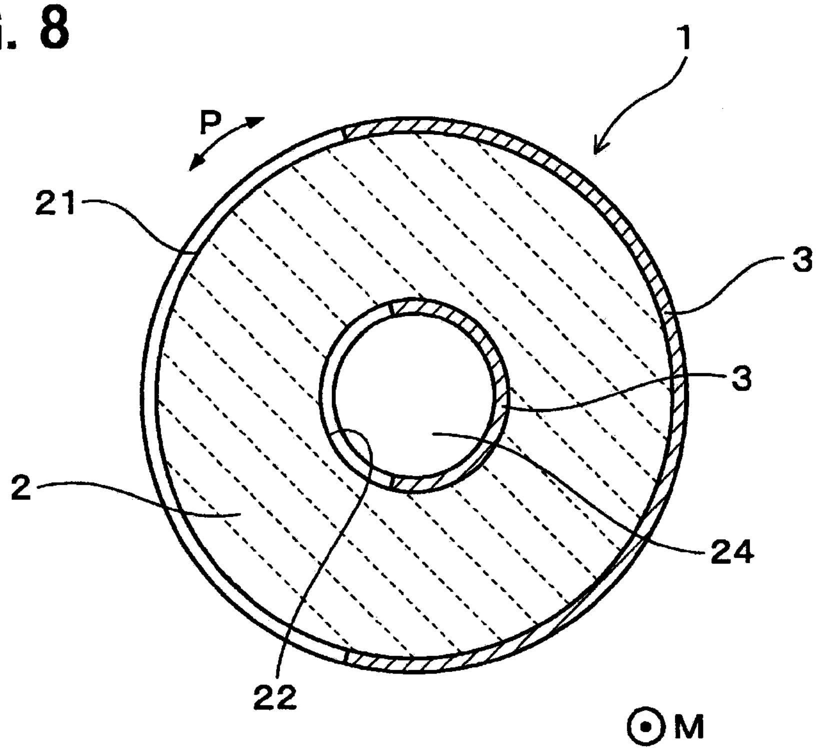
FIG. 8 is a cross-sectional view illustrating a thermoelectric conversion element according to a third embodiment.

A thermoelectric conversion element 1 according to a third embodiment is described with reference to FIG. 8 in which an electromotive component 3 is arranged on both of the outer circumference surface 21 and the inner circumference surface 22 of the magnetic body 2 having the cylindrical shape.

The thermoelectric conversion element 1 of the present embodiment is produced as follows, but is not limited. After forming the electromotive component pattern 30 on the both surfaces (the outer circumference surface 21 and the inner circumference surface 22) of the magnetic body 20 having the board shape, similarly to FIG. 5, the magnetic body 20 having the board shape is rounded into a cylindrical shape. Thus, the thermoelectric conversion element 1 can be obtained in which the electromotive component 3 is formed on the outer circumference surface 21 and the inner circumference surface 22 of the magnetic body 2.

The others are the same as those of the first embodiment or the second embodiment.

In this embodiment, a spin flow which goes outward in the radial direction of the magnetic body 2 flows into the electromotive component 3 arranged on the outer circumference surface 21 of the magnetic body 2, and a spin flow which goes inward in the radial direction of the magnetic body 2 flows into the electromotive component 3 arranged on the inner circumference surface 22 of the magnetic body 2. Therefore, by forming the temperature gradient ΔT in the radial direction of the magnetic body 2, the electromotive force V is generated at the electromotive component 3 on the outer circumference surface 21 and the electromotive force V is generated at the electromotive component 3 on the inner circumference surface 22.

Thus, according to the present embodiment, the electromotive force V can be efficiently produced in both of the electromotive component 3 on the outer circumference surface 21 and the electromotive component 3 on the inner circumference surface 22. In addition, similar effects and advantages can be obtained as the first embodiment.

(Fourth Embodiment)

Figure 9:
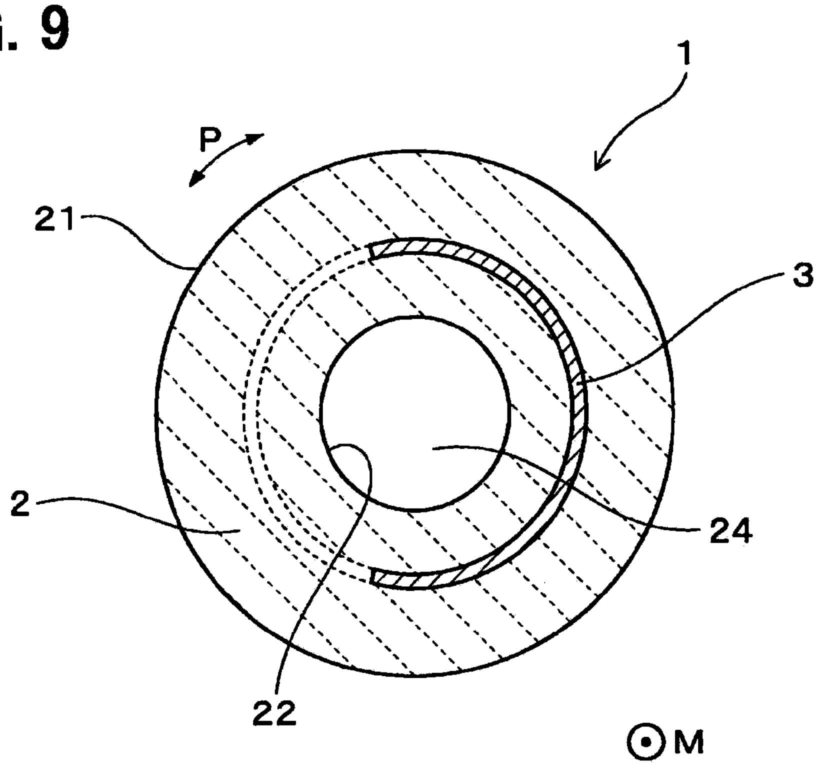
FIG. 9 is a cross-sectional view illustrating a thermoelectric conversion element according to a fourth embodiment.

A thermoelectric conversion element 1 according to a fourth embodiment is described with reference to FIG. 9 in which an electromotive component 3 is arranged inside of the magnetic body 2. Specifically, the electromotive component 3 is totally embedded to the inside of the magnetic body 2, as shown in FIG. 9. In this case, the electromotive component 3 is spirally formed around the shaft hole 24 in the circumferential direction P.

The thermoelectric conversion element 1 of the present embodiment is produced as follows, but is not limited. After forming the electromotive component pattern 30 on the surface of the magnetic body 20 having the board shape, similarly to FIG. 5, other magnetic body having the board shape is arranged onto the electromotive component pattern 30 of the magnetic body 20 so as to form a stacked body. Then, the stacked body is rounded into a cylindrical shape. Thus, the thermoelectric conversion element 1 can be obtained in which the electromotive component 3 is embedded inside of the magnetic body 2. Other processes are the same as those of the first embodiment.

In the present embodiment, a spin flow is induced at the outer periphery part of the magnetic body 2 on the outer side of the electromotive component 3, due to the temperature gradient between the outer circumference surface 21 of the magnetic body 2 and the electromotive component 3. Further, a spin flow is induced at the inner periphery part of the magnetic body 2 on the inner side of the electromotive component 3, due to the temperature gradient between the inner circumference surface 22 of the magnetic body 2 and the electromotive component 3.

Therefore, for example, by forming a difference in temperature between the inner circumference surface and the outer circumference surface of the magnetic body 2, the spin flow flows into the electromotive component 3 from both the outer side and the inner side of the magnetic body 2 between the inner circumference surface and the outer circumference surface in the radial direction. Thus, the electromotive force V is generated from the electromotive component 3.

Thus, also in this embodiment, the electromotive force V can be efficiently produced by the electromotive component 3. In addition, similar effects and advantages can be obtained as the first embodiment.

(Fifth Embodiment)

Figure 10:
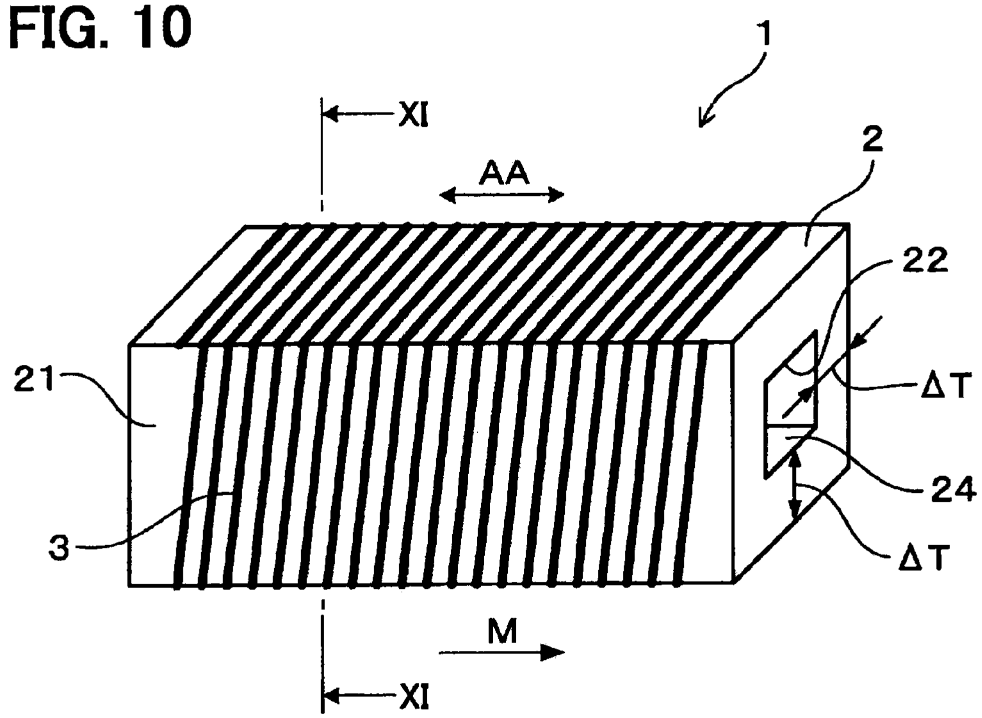
FIG. 10 is a perspective view illustrating a thermoelectric conversion element according to a fifth embodiment.
Figure 11:
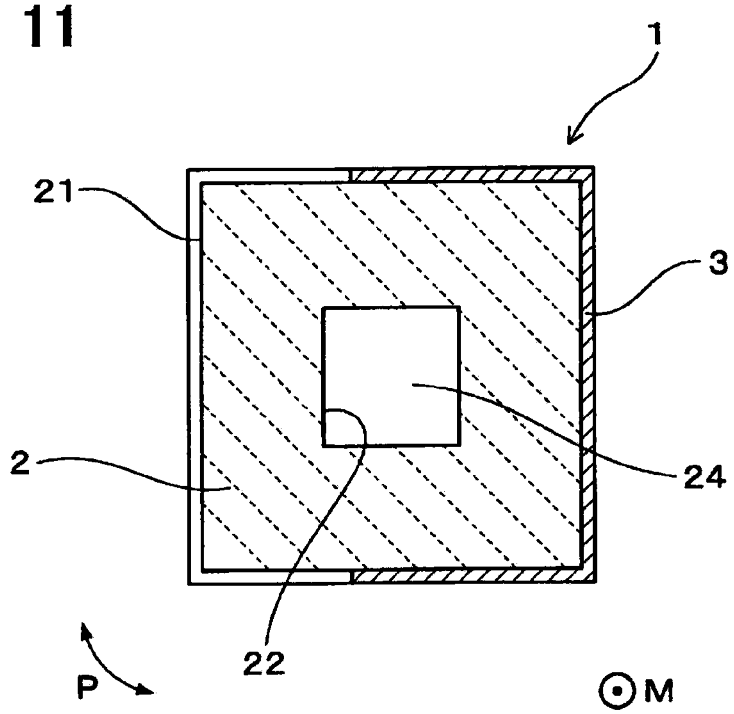
FIG. 11 is a cross-sectional view taken along a line XI-XI of FIG. 10.

A thermoelectric conversion element 1 according to a fifth embodiment is described with reference to FIG. 10 and FIG. 11 in which the magnetic body 2 has a pipe shape. Specifically, the outer shape of the magnetic body 2 is a square pipe, as shown in FIG. 10 and FIG. 11.

The electromotive component 3 is spirally arranged to the outer periphery surface 21 of the magnetic body 2 having the square pipe shape. As show in FIG. 10, the outer periphery surface 21 and the inner periphery surface 22 of the magnetic body 2 have approximately square shape in the cross-section perpendicular to the axial direction AA.

The others are the same as those of the first embodiment. In addition, similar effects and advantages can be obtained as the first embodiment.

The thermoelectric conversion element is not restricted to the above-mentioned embodiments. For example, the fifth embodiment may be combined with one of the second embodiment, the third embodiment and the fourth embodiment. Moreover, the shape of the magnetic body may be other pipe shape such as ellipse cylindrical shape, polygon cylindrical shape, etc. in addition to the cylindrical shape and the square pipe shape.

Such changes and modifications are to be understood as being within the scope of the present disclosure as defined by the appended claims.

What is claimed is:

1. A thermoelectric conversion element comprising:

a magnetic body having a pipe shape; and an electromotive component arranged to at least one of an outer surface, an inner surface, and an inside of the magnetic body, wherein the electromotive component contains a material having a spin orbit coupling, the magnetic body is magnetized in an axial direction and has a temperature gradient in a radial direction, and the electromotive component is a one-piece element spirally arranged around the magnetic body having the pipe shape along a circumferential direction; wherein the electromotive component is arranged on the inner surface of the magnetic body.

2. The thermoelectric conversion element according to claim 1, wherein an additional electromotive component is arranged on the outer surface of the magnetic body.

3. The thermoelectric conversion element according to claim 1, wherein the magnetic body has a cylindrical shape.

4. The thermoelectric conversion element according to claim 1, wherein the magnetic body has a cylindrical hole passing through the magnetic body in the axial direction.

5. The thermoelectric conversion element according to claim 4, wherein the cylindrical hole passes entirely through the magnetic body.

6. The thermoelectric conversion element according to claim 5, wherein the cylindrical hole has a diameter larger than a thickness of the magnetic body in the radial direction.

7. The thermoelectric conversion element according to claim 5, wherein the cylindrical hole is an open hole.

8. The thermoelectric conversion element according to claim 4, wherein the cylindrical hole has a diameter larger than a thickness of the magnetic body in the radial direction.

9. The thermoelectric conversion element according to claim 4, wherein the cylindrical hole is an open hole.

10. The thermoelectric conversion element according to claim 1, wherein the pipe shape is a circular cylindrical cylinder.

11. The thermoelectric conversion element according to claim 10, wherein the magnetic body has a cylindrical hole passing through the magnetic body in the axial direction.

12. The thermoelectric conversion element according to claim 11, wherein the cylindrical hole passes entirely through the magnetic body.

13. The thermoelectric conversion element according to claim 12, wherein the cylindrical hole has a diameter larger than a thickness of the magnetic body in the radial direction.

14. The thermoelectric conversion element according to claim 12, wherein the cylindrical hole is an open hole.

15. The thermoelectric conversion element according to claim 11, wherein the cylindrical hole has a diameter larger than a thickness of the magnetic body in the radial direction.

16. The thermoelectric conversion element according to claim 11, wherein the cylindrical hole is an open hole.

* * * * *